United States Patent [19]

Tanaka

[11] Patent Number: 5,357,144
[45] Date of Patent: Oct. 18, 1994

[54] COMPLEMENTARY LOGIC CIRCUIT

[75] Inventor: Masato Tanaka, Tokyo, Japan

[73] Assignee: Sony Corporation, Tokyo, Japan

[21] Appl. No.: 5,906

[22] Filed: Jan. 15, 1993

[30] Foreign Application Priority Data

Jan. 17, 1992 [JP] Japan .................... 4-025863

[51] Int. Cl.$^5$ ........................ H03K 17/18; H03K 356
[52] U.S. Cl. .................. 307/247.1; 307/272.2; 307/470
[58] Field of Search ............... 307/272.1, 272.2, 470, 307/247.1; 328/206

[56] References Cited

U.S. PATENT DOCUMENTS

| | | | |
|---|---|---|---|
| 4,001,611 | 1/1977 | Maruyama et al. | 307/247.1 |
| 4,051,352 | 9/1977 | Eichelberger et al. | 307/247.1 |
| 4,424,581 | 1/1984 | Kawai | 307/272.2 |
| 4,562,427 | 12/1985 | Ecton | 307/465 |
| 4,627,085 | 12/1986 | Yuen | 307/470 |
| 4,864,161 | 9/1989 | Norman et al. | 307/272.2 |
| 4,871,930 | 10/1989 | Wong et al. | 307/465 |
| 4,891,531 | 1/1990 | Kobayashi et al. | 307/272.1 |
| 4,903,223 | 2/1990 | Norman et al. | 307/465 |
| 5,003,204 | 3/1991 | Cushing et al. | 307/272.2 |
| 5,018,168 | 5/1991 | Matsuoka | 307/470 |
| 5,130,568 | 7/1992 | Miller et al. | 307/272.2 |
| 5,140,176 | 8/1992 | Okino | 307/272.2 |
| 5,162,667 | 11/1992 | Yasui et al. | 307/272.2 |
| 5,175,447 | 12/1992 | Kawasaki et al. | 307/272.2 |
| 5,189,315 | 2/1993 | Akata | 307/272.2 |
| 5,220,215 | 6/1993 | Douglas et al. | 307/272.2 |

OTHER PUBLICATIONS

Edge-Triggered LSSD Compatible Set/Reset Latch, R. H. Farrell and N. A. Katz IBM Technical Disclosure Bulletin vol. 26 No. 5 Oct. 1983.

Primary Examiner—Timothy P. Callahan
Assistant Examiner—T. T. Lam
Attorney, Agent, or Firm—Lewis H. Eslinger; Jay H. Maioli

[57] ABSTRACT

There is disclosed a circuit arrangement to permit reduction of the occupation area and the power consumption in a complementary logic circuit constituting a sequence circuit such that it is used in a manner switched between ON state and OFF state. This circuit arrangement as a sequence circuit comprises a delay circuit 2 comprised of a group of D flip-flops of the dynamic type and a combination circuit 1 connected to the delay circuit, thus to allow all inputs of the combination circuit 1 to be compulsorily brought into a predetermined state during an operation stop period of the delay circuit by an input control circuit 3, and to allow the delay circuit to be placed in a data through condition, with each of master and slave latches of the group of flip-flops constituting the delay circuit being caused to be inoperative or inactive, by an operation stop control circuit 4.

8 Claims, 6 Drawing Sheets

COMPLEMENTARY LOGIC CIRCUIT

BACKGROUND OF THE INVENTION

1. Field of the Invention

This invention relates to a complementary logic circuit constituting a sequence circuit comprised of a delay circuit using a group of D (delay) type flip-flops and a combination circuit.

2. Description of the Prior Art

As a LSI (Large Scale Integrated) circuit for digital processing, complementary logic circuits of the CMOS (Complementary Symmetry MOS) structure, etc. have been conventionally known.

Generally, a sequence circuit is widely known as a logic circuit of which output is not determined by an input, but depends upon a past record or history of an input. Such sequence circuit is comprised, as shown in FIG. 1, for example, of a delay circuit 41 using a group of D (delay) type flip-flops adapted for delaying input data by one clock to output the delayed data, and a combination circuit 42 for determining a subsequent output from all or a portion of that output and an input.

More particularly, a D (delay) type flip-flop (hereinafter referred to as a D flip-flop) is comprised, as shown in FIG. 2, for example, of two sets of cascade-connected latch circuits, i.e., a master latch 43 and a slave latch 44. These master and slave latches 43 and 44 are respectively supplied with clocks $\phi_1$, $\phi_2$ opposite to each other in phase as an enable input. When the enable inputs are at high level, these latches are brought into a data through condition where input data directly outputted, while when they are at low level, those latches carry out a latch operation. Thus, it appears that the D flip-flop carries out an edge trigger operation as a whole.

Further, as a latch circuit, there have been conventionally known a static latch comprised of two analog switches 45, 46 and two inverters 47, 48 as shown in FIG. 3, and a dynamic latch comprised of a single analog switch 49 and a single inverter 50 as shown in FIG. 4.

Meanwhile, in a CMOS-LSI, the analog switch is comprised of two transistors, and the inverter is also comprised of two transistors. Accordingly, the static latch is comprised of eight transistors, and the dynamic latch is comprised of four transistors. Since the D flip-flop is constituted with two sets of latch circuits, it has 16 transistors in the case of the static type, and has 8 transistors in the case of the dynamic type.

For this reason, the occupation area of the D flip-flop of the dynamic type can be reduced to one half of that of the D flip-flop of the static type. Moreover, the static latch may involve an unnecessary power consumption due to the fact that the input sampling analog switch and the output holding analog switch are turned ON at the same time momentarily. However, the D flip-flop of the dynamic type has not such unnecessary power consumption because only one sample-hold analog switch exists. As a result, the quantity of power consumption can be reduced to a value less than one half of that of the static latch.

However, in the case of the dynamic latch, since data is held only by the gate capacity of two P-channel and N-channel MOS transistors constituting an inverter, it is possible to hold data only for a short time. For this reason, when the enable signal is stopped at low level, the gate voltage becomes unstable, and when it becomes an intermediate level between low level and high level, two P-channel and N-channel MOS transistors constituting inverter are both turned ON at the same time. Thus, an extraordinary large punch-through current will flow from the power supply toward the ground. Accordingly, such D flip-flop of the dynamic type is not suitable for a circuit required to be operated and stopped, so it could be used only in a circuit operative at all times.

For this reason, in a complementary logic circuit constituting a sequence circuit used in a manner switched between ON state and OFF state, it is impossible to allow a group of D flip-flops of the delay circuit to be of the dynamic type, so a group of D flip-flops of the static type having large occupation area and power consumption was adopted for the delay circuit.

OBJECTS AND SUMMARY OF THE INVENTION

In view of actual circumstances of conventional complementary logic circuits as described above, with a view to reducing the occupation area and the power consumption in a complementary logic circuit constituting a sequence circuit used in a manner switched between ON state and OFF state, this invention contemplates providing a complementary logic circuit in which a group of D flip-flops of the dynamic type is employed as a delay circuit, thus making it possible to avoid an unnecessary power consumption due to a punch-through current in an operation stop state.

In accordance with this invention, there is provided a complementary logic circuit constituting a sequence circuit, comprising: delay circuit means comprised of a group of dynamic delay type flip-flops; a combination circuit means connected to the delay circuit means; input control means connected to the input side of the combination circuit means, and adapted for allowing all inputs of the combination circuit to be compulsorily placed at a predetermined logic level during an operation stop period of the delay circuit means; and operation stop control means connected to the delay circuit means, and adapted for allowing each of master and slave latches of the dynamic delay type flip-flops constituting the delay circuit means to be inoperative of inactive so that the delay circuit means is brought into a data through condition during the operation stop period.

The operation stop control means may generate first and second clocks to be supplied to allow inputs of the dynamic delay type flip-flops to be brought into an enable state, and to allow these clocks to be placed at high level during the operation stop period.

The operation stop period is essentially dependent upon a stop control signal supplied to the input control means and the operation stop control means, simultaneously.

In a practical sense, the input control means may include first AND gate means of which output terminal is connected to one input terminal of the combination circuit means, input data and the stop control signal being adapted to be supplied to input terminals of the first AND gate means, respectively. The input control means may further comprise second AND gate means connected between the combination circuit means and the delay circuit means, output data from the combination circuit means to be supplied to the delay circuit means being controlled by supplying the operation stop control signal to the second AND gate means.

When needed, connecting position of the input control means may be changed so that it is connected to the input side of the delay circuit means.

Especially, the complementary logic circuit of the invention may be advantageously applied, in that the occupation area and the power consumption can be effectively reduced, to a FIR equalizer or an IIR filter which requires a sequence circuit used in a manner switched between ON state and OFF state.

In the complementary logic circuit according to this invention thus featured, a sequence circuit is constituted with delay circuit means comprised of a group of D flip-flops of the dynamic type and a combination circuit to allow all inputs of the combination circuit to be compulsorily brought into a predetermined state by using input control means during an operation stop period of the delay circuit means, and to allow the delay circuit means to be brought into a data through condition by using the operation stop control means with each of master and slave latches of the group of D flip-flops constituting the delay circuit means being caused to be inoperative or inactive.

DESCRIPTION OF THE PREFERRED EMBODIMENTS

Preferred embodiments of a complementary logic circuit according to this invention will now be described in detail with reference to the attached drawings.

Figure 1:
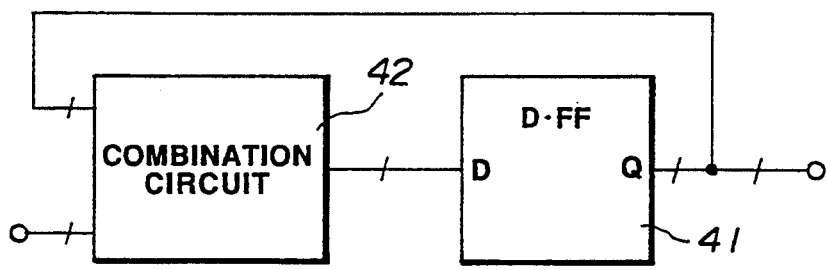
FIG. 1 is a block diagram showing a basic configuration of a sequence circuit.
Figure 2:
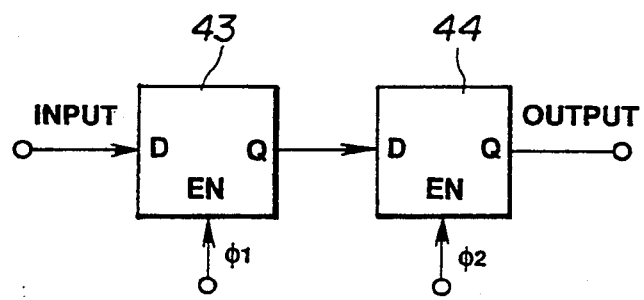
FIG. 2 is a block diagram showing the internal configuration of a D flip-flop used as a delay circuit constituting the above-mentioned sequence circuit.
Figure 3:
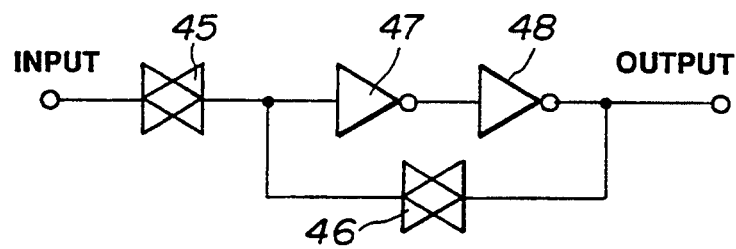
FIG. 3 is a block diagram showing the internal configuration of a static latch constituting the above-mentioned D flip-flop.
Figure 4:
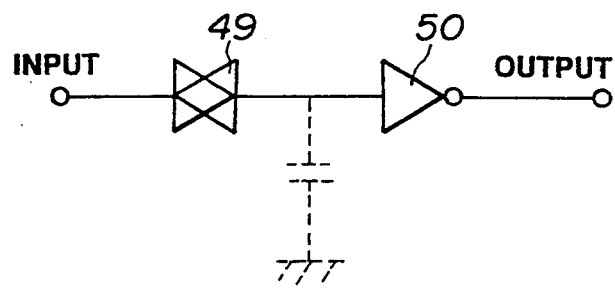
FIG. 4 is a block diagram showing the internal configuration of a dynamic latch constituting the above-mentioned D flip-flop.
Figure 5:
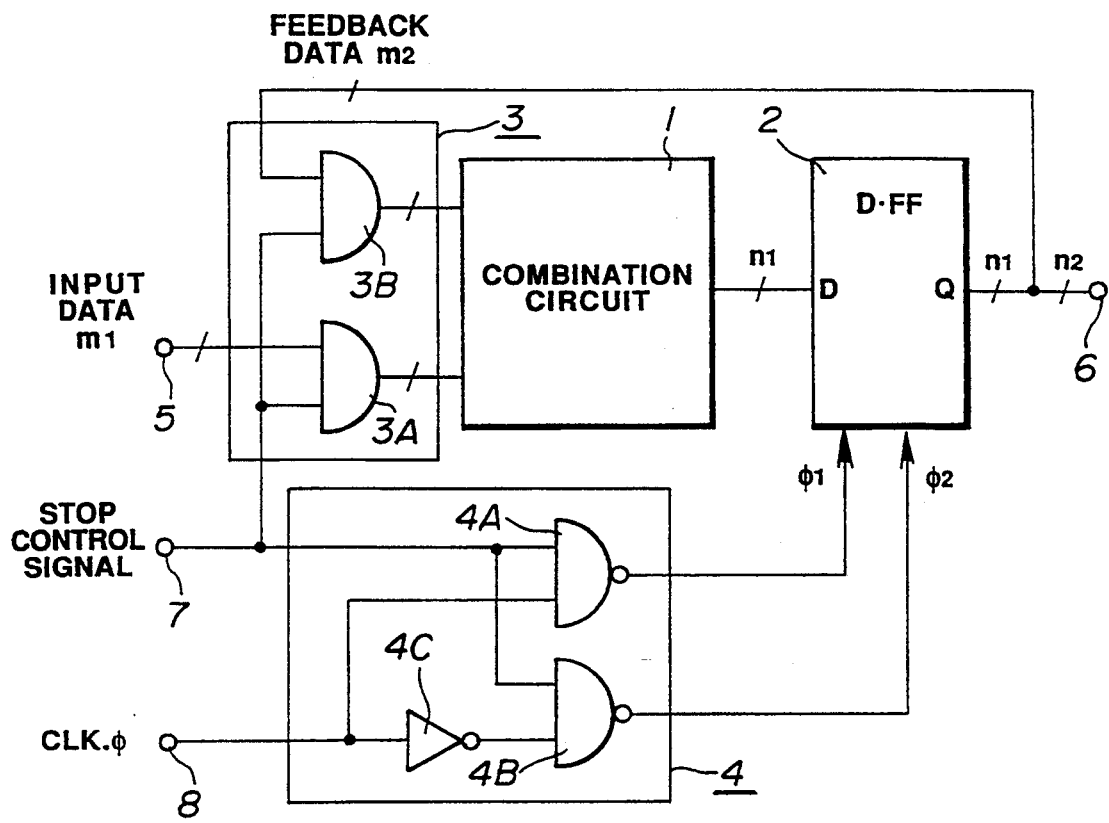
FIG. 5 is a block diagram showing the configuration of an embodiment of a complementary logic circuit according to this invention.

An embodiment of a complementary logic circuit according to this invention is constituted as shown in FIG. 5, for example.

This complementary logic circuit is a CMOS·LSI in which a sequence circuit is composed of a combination circuit 1 and a delay circuit 2, and includes an input control circuit 3 and an operation stop control circuit 4 for an operation stop control.

The above-mentioned combination circuit 1 is adapted so that its output is fed back through the above-mentioned delay circuit 2. Further, this combination circuit 1 is provided on its input side with the input control circuit 3, and is adapted so that input data of $m_1$ bits given to a data input terminal 5 is delivered through the input control circuit 3, and that feedback data of $m_2$ bits from the delay circuit 2 is delivered through the input control circuit 3. Thus, the combination circuit 1 is adapted to generate output data of $n_1$ bits from the input data of $m_1$ bits and the feedback data of $m_2$ bits to deliver the output data of $n_1$ bits to the delay circuit 2. It is to be noted that the above-mentioned bit numbers $m_1$, $m_2$ and $n_1$ are an arbitrary integer.

Further, the above-mentioned delay circuit 2 is comprised of a group of D flip-flops of the dynamic type. This delay circuit 2 is such that a group of D flip-flops become operative in response to two-phase clocks $\phi_1$, $\phi_2$ delivered through the operation stop control circuit 4. Moreover, the delay circuit 2 is adapted to delay, by one clock, output data of $n_1$ bits delivered from the combination circuit 1 to deliver the feedback data of $m_2$ bits to the combination Circuit 1 through the input control circuit 3, and to output data of $n_2$ bits from a data output terminal 6. It is to be noted that the above-mentioned bit number $n_2$ is also an arbitrary integer.

Here, in the CMOS·LSI, a D flip-flop of the dynamic type can be constituted with eight transistors. Accordingly, the chip occupation area thereof can be reduced to one half of that of the D flip-flop of the static type which requires 16 transistors, and the power consumption is also small. It is to be noted that the D flip-flop of the dynamic type may be constituted with a clocked inverter.

Further, the above-mentioned input control circuit 3 is comprised of an AND gate 3A for gate-controlling the input data of $m_1$ bits, and an AND gate 3B for gate-controlling the feedback data of $m_2$ bits. These AND gates 3A, 3B are adapted so that, their gates are opened and closed by an operation stop control signal delivered to an operation stop control input terminal 7. This operation stop control signal is at high level for an operation period, and is at low level for an operation stop period. During the operation period, the respective AND gates 3A, 3B are opened by the operation stop control signal, so the input data of $m_1$ bits and the feedback data of $m_2$ bits are inputted to the combination circuit 1. On the other hand, for the operation stop period, the respective AND gates 3A, 3B are closed, so all bits of an input of the combination circuit 1 are caused to be at low level.

Furthermore, the above-mentioned operation stop control circuit 4 is composed of two NAND gates 4A, 4B and a single inverter 4C. To one input terminal of the NAND gate 4A, a clock $\phi$ is directly delivered from a clock input terminal 8. Moreover, to one input terminal of the NAND gate 4B, the above clock $\phi$ is delivered through an inverter 4C from the clock input terminal 8. In addition, to each of the other input terminals of the NAND gates 4A, 4B, an operation stop control signal is delivered from the stop control input terminal 7. For an operation period during which the operation stop control signal is at high level, the respective NAND gates 4A, 4B are opened, whereby the operation stop control circuit 4 generates two-phase clocks $\phi_1$, $\phi_2$ from the above-mentioned clock $\phi$, and allows the D flip-flop group of the delay circuit 2 to be operative with these two-phase clocks $\phi_1$, $\phi_2$ being as an enable input. Further, for an operation stop period during which the operation stop control signal is at low level, the respective NAND gates 4A, 4B are closed, so respective two-phase clocks $\phi_1$, $\phi_2$ as an enable input of the group of D flip-flops of the delay circuit 2 are caused to be compulsorily placed at high level. Thus, during the operation stop period, the operation stop control circuit 4 allows respective master and slave latches of the group of D flip-flops to be inoperative or inactive so that the delay circuit 2 is placed in a data through condition.

Figure 6:
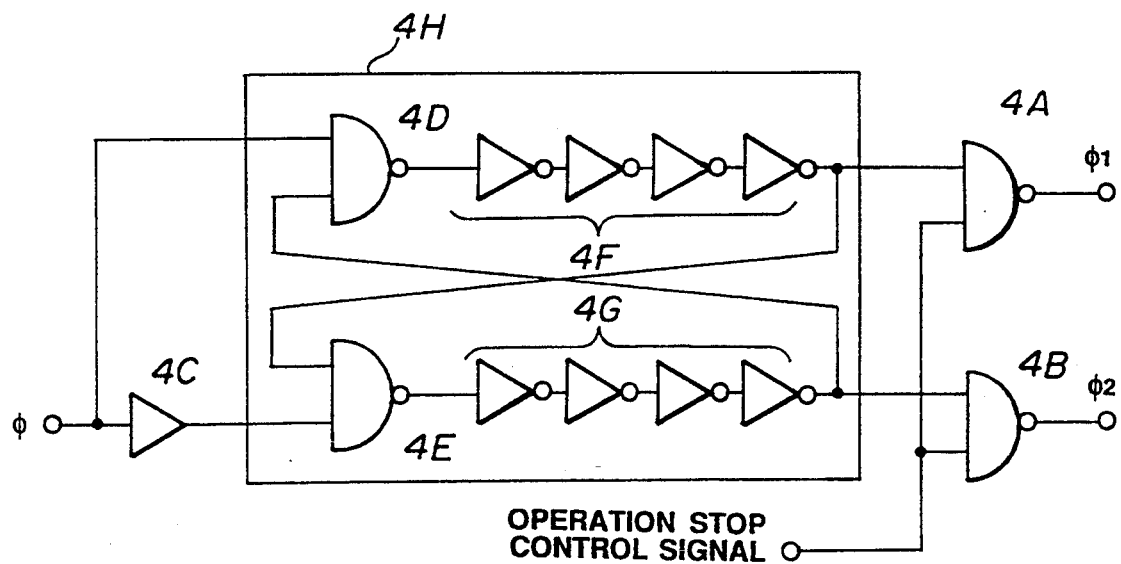
FIG. 6 is a block diagram showing a modified example of an operation stop control circuit in the above-mentioned complementary logic circuit.
Figures 7A, 7B, 7C, 7D:
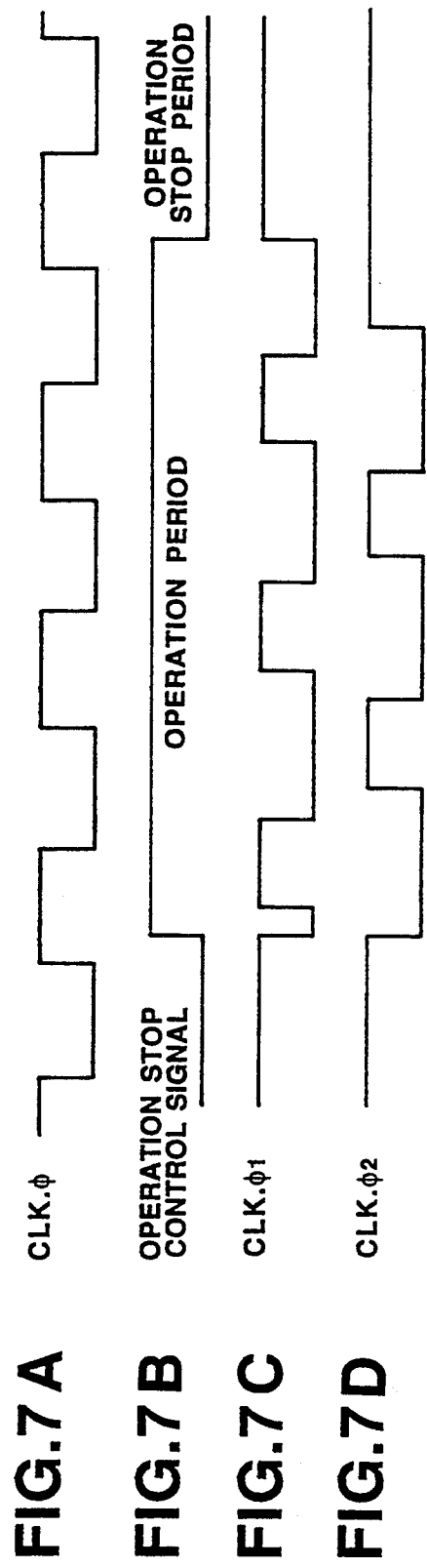
FIGS. 7A–7D are timing charts used for explanation of the operation of the above-mentioned operation stop control circuit.

It is to be noted that respective NAND gates 4A, 4B of the operation stop control circuit 4 may be OR gates with NOT input, respectively. Further, the stop control circuit 4 may be such that a bi-stable circuit 4H of such a structure to respectively reciprocally deliver outputs of NAND gates 4D, 4E to the other input terminals thereof through inverters 4F, 4G of plural stages is provided as shown in FIG. 6, for example, to deliver two outputs of the bi-stable circuit 4H to respective one input terminals of the NAND gates 4A, 4B. As the operation of this operation stop control circuit 4 is indicated by the timing chart of FIGS. 7A–7D, for an operation period during which the operation stop control signal is at high level, the respective NAND gates 4A, 4B are opened, so two-phase clocks $\phi_1$, $\phi_2$ are outputted, and for an operation stop period during which the operation stop control signal is at low level, the respective NAND gates 4A, 4B are closed, so the above-mentioned two-phase clocks $\phi_1$, $\phi_2$ are caused to be compulsorily at high level.

By allowing each of master and slave latches of the group of D flip-flops to be inoperative or inactive so that the delay circuit 2 is placed in a data through condition for the operation stop period as described above, it is possible to avoid an unnecessary power consumption due to a punch-through current in the operation stop condition.

Namely, in the complementary logic circuit of this embodiment, since a sequence circuit is constituted by delay circuit 2 using a group of D flip-flop of the dynamic type and combination circuit 1, the occupation area of the above-mentioned group of D flip-flops can be reduced to about one half of that in the case where a group of D flip-flops of the static type are used as a delay circuit. In addition, since all inputs of the combination circuit 1 are compulsorily brought into a predetermined state, and the delay circuit 2 is caused to be all brought into a data through condition with each master and slave latches of the group of flip-flops being caused to be inoperative or inactive, there is no unnecessary power consumption due to a punch-through current in the operation stop condition, thus making it possible to reduce power consumption to much degree.

Figure 8:
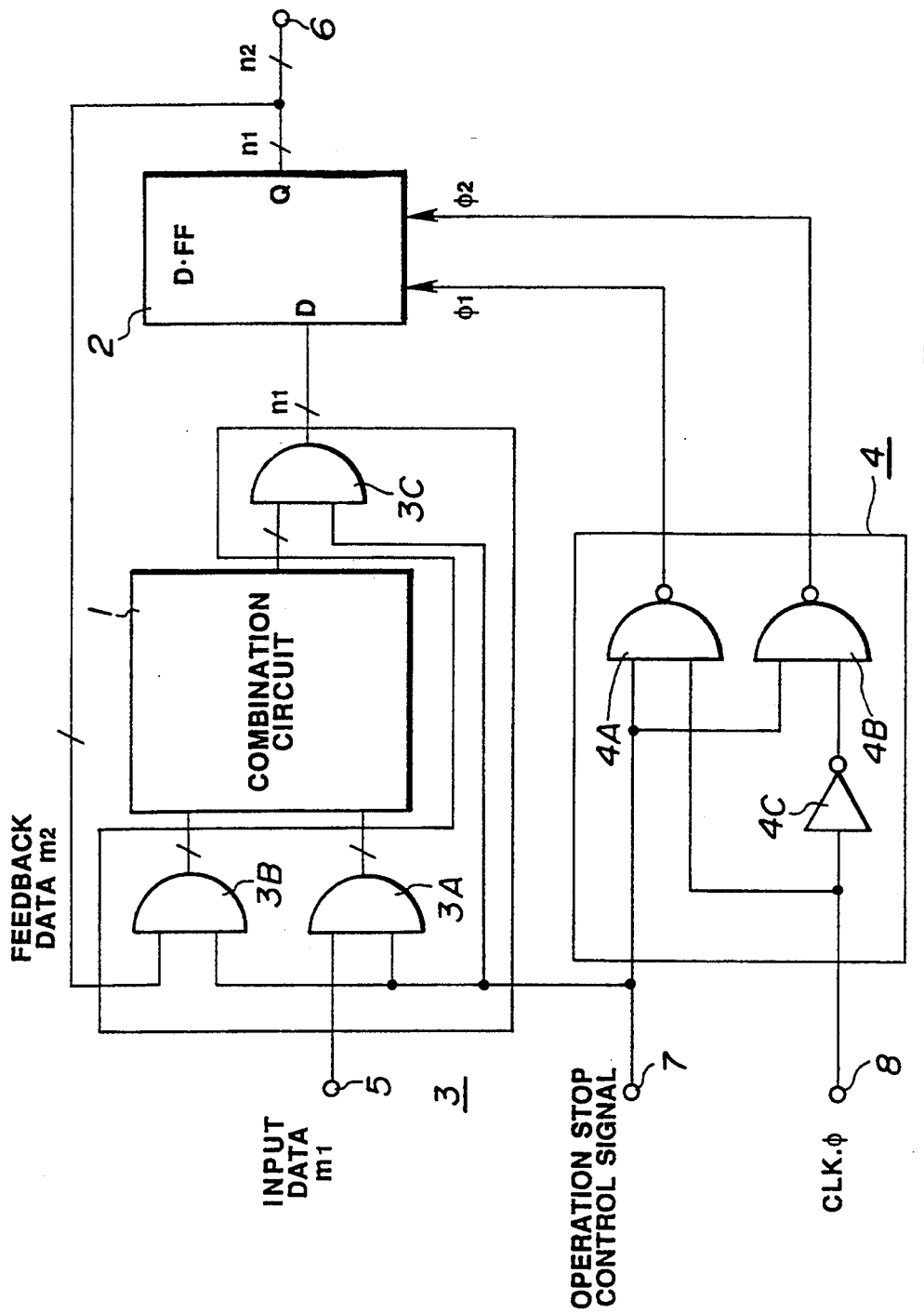
FIG. 8 is a block diagram showing the configuration of another embodiment of a complementary logic circuit according to this invention.

It is to be noted that while, in the complementary logic circuit of the above-described embodiment, input control circuit 3 is provided on the input side of the combination circuit 1 to gate-control the input data of $m_1$ bits by the AND gate 3A, and to gate-control the feedback data of $m_2$ bits by the AND gate 3B, the input control circuit 3 may be of a structure such that an AND gate 3C for gate-controlling output data of $n_1$ bits from the combination circuit 1 is further provided as shown in FIG. 8 in addition to the AND gates 3A, 3B, or may be of a structure such that AND gate 3C is provided in place of the AND gates 3A, 3B. In addition, while the input control circuit 3 is caused to be of an AND gate structure to allow all bits of an input of the combination circuit 1 to be compulsorily placed at low level for an operation stop period. However, since there can be employed any configuration such that transition of state does not occur in an input of the combination circuit 1 for an operation stop period, there may be employed, depending upon circumstances, a configuration such that all bits of an input of the combination circuit 1 are compulsorily caused to be at high level for an operation stop period.

Figure 9:
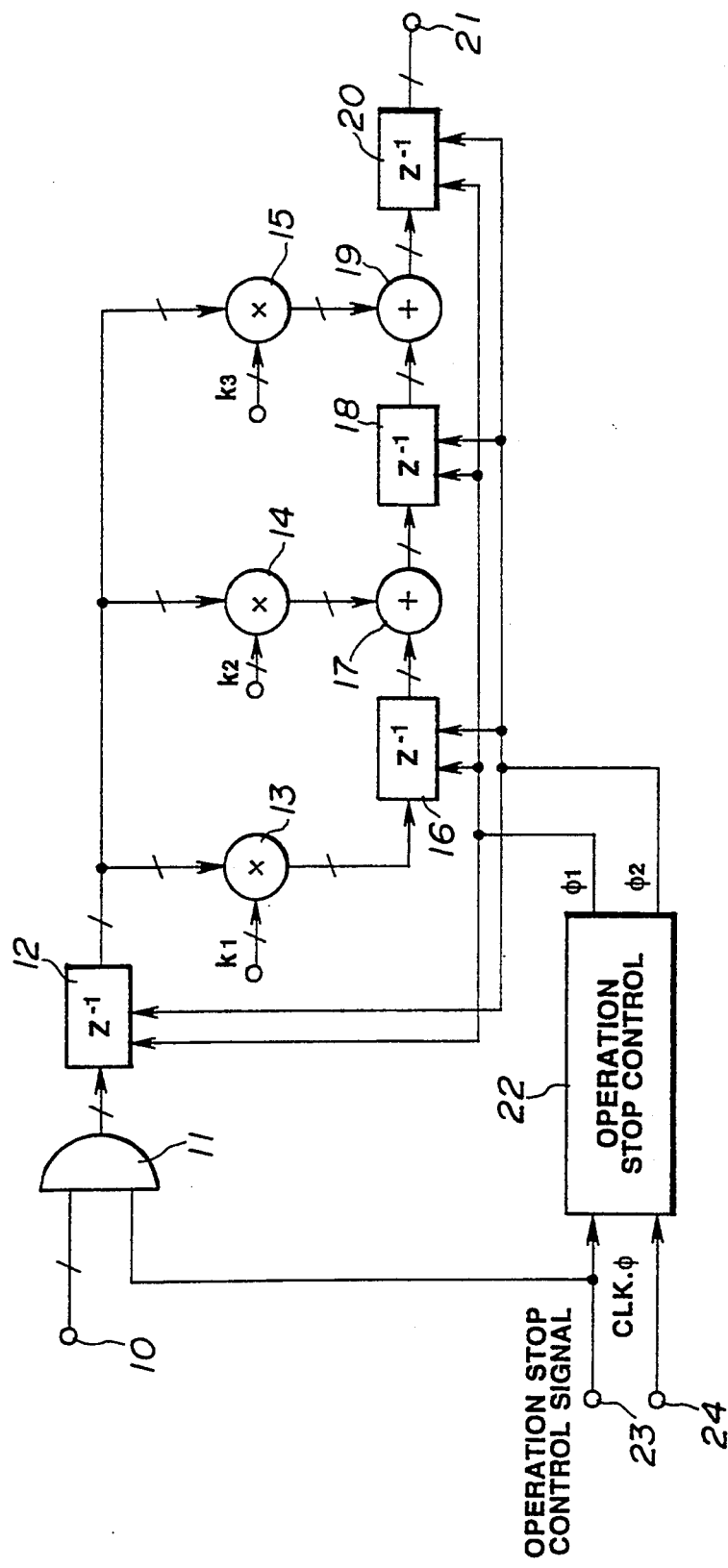
FIG. 9 is a block diagram showing the configuration of a FIR equalizer as an actual example of a complementary logic circuit according to this invention.

As an actual example of the complementary logic circuit according to this invention, an equalizer of the FIR (Finite Impulse Response) type is shown in FIG. 9.

In this FIR equalizer, input data of m bits given to an input terminal 10 is delivered to a delay circuit 12 of the input stage through an AND gate 11 for input control.

The delay circuit 12 delays, for one clock period, input data of m bits delivered through the AND gate 11 to deliver the delayed input data to first to third parallel multipliers 13, 14 and 15.

The first parallel multiplier 13 multiplies the input data by an equalizer coefficient $k_1$ to deliver the multiplied output data to an adder 17 through a delay circuit 16 of the preceding stage. Further, the second parallel multiplier 14 multiplies the input data by an equalizer coefficient $k_2$ to deliver the multiplied output data to the adder 17. This adder 17 adds the multiplied output data of the second parallel multiplier 14 and the multiplied output data of the first parallel multiplier 13 delivered through the delay circuit 16 of the preceding stage to deliver the added output data to an adder 19 through a delay circuit 18 of the succeeding stage. Further, the third parallel multiplier 15 multiplies the input data by an equalizer coefficient $k_3$ to deliver the multiplied output data to the adder 19. This adder 19 adds the multiplied output data of the third parallel multiplier 15 and the added output data of the adder 17 delivered through the delay circuit 18 of the succeeding stage to output the added output data from an output terminal 21 through a delay circuit 20 of the output stage.

These delay circuits 12, 16, 18 and 20 are respectively comprised of D flip-flop groups of the dynamic type, and are such that the D flip-flop groups become operative by two-phase clocks $\phi_1$, $\phi_2$ delivered through an operation stop control circuit 22 to thereby delay input data by one clock period to output the delayed data.

The input control AND gate 11 is adapted so that opening/closing of gate is carried out by an operation stop control signal delivered to an operation stop control input terminal 23. This AND gate 11 is opened for an operation stop period during which the operation stop control signal is caused to be at high level to deliver input data of m bits to the delay circuit 12 of the input stage. Further, for an operation stop period during which the operation stop control signal is caused to be at low level, the AND gate 11 is closed to deliver input data of which all bits are at low level to the delay circuit 12 of the input stage.

Further, the stop control circuit 22 generates two-phase clocks $\phi_1$, $m_2$ on the basis of a clock $\phi$ delivered from a clock input terminal 24, and allows, for an operation period during which an operation stop control signal delivered from the operation stop control input terminal 22 is at high level, the D flip-flop groups of the respective delay circuits 12, 16, 18 and 20 to be operative with the two-phase clocks $\phi_1$, $\phi_2$ being as an enable input. On the other hand, for an operation stop period during which the operation stop control signal is at low level, the operation stop control circuit 22 allows the two-phase clocks $\phi_1$, $\phi_2$ to be both compulsorily at high level to allow the respective delay circuits to be placed in a data through condition with respective latches of the groups of flip-flops constituting the respective delay circuits being caused to be inoperative or inactive.

In the FIR equalizer of such configuration, it is brought into an operative or active state only for an operation period during which an operation stop control signal delivered to the stop control input terminal 23 is at high level, and for an operation stop period during which the operation stop control signal is at low level, any transition of state does not take place in respective components, so this equalizer can wait until the subsequent operation period with an unnecessary power consumption being extremely small.

Figure 10:
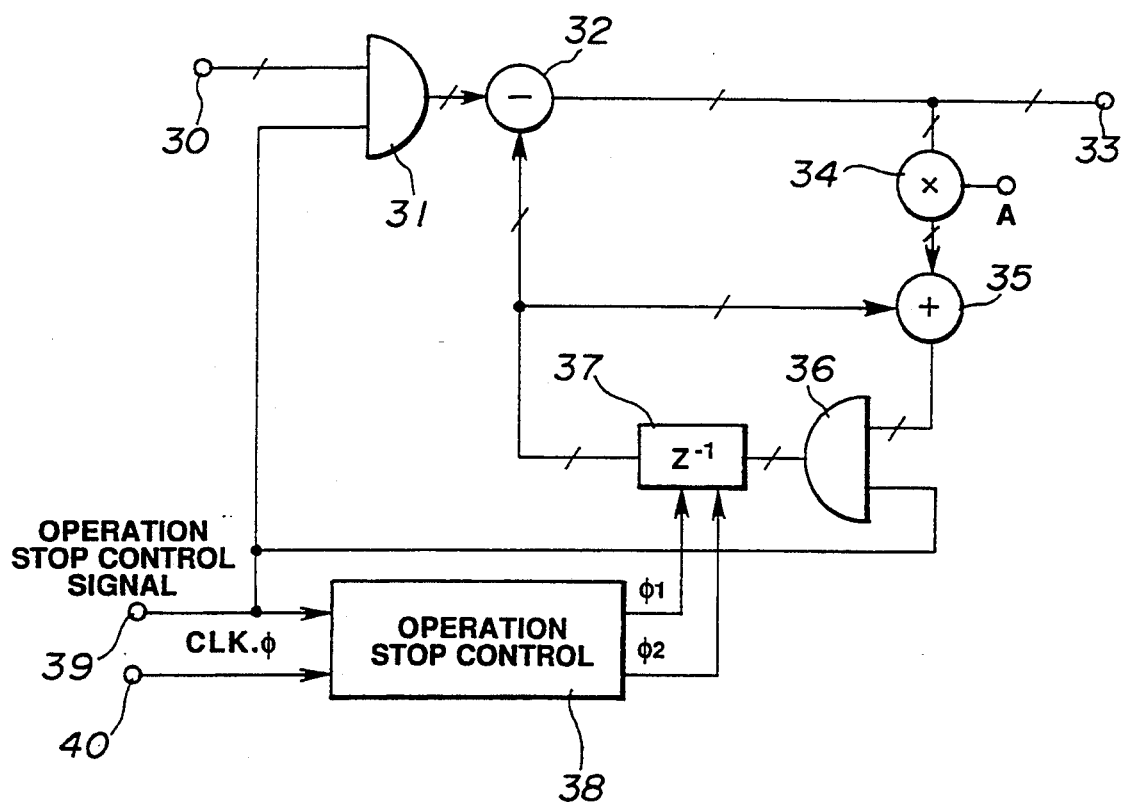
FIG. 10 is a block diagram showing the configuration of an IIR filter as another actual example of a complementary circuit according to this invention.

As another actual example of the complementary logic circuit according to this invention, a notch filter of the IIR (Infinite Impulse Response) type is shown in FIG. 10.

In this IIR filter, input data of m bits given to an input terminal 30 is delivered to a subtracter 32 through an AND gate 31 for input control. Then, subtracted output data of the subtracter 32 is outputted through an output terminal 33, and is delivered to an adder 35 through a coefficient circuit 34. Then, added output data of the adder 35 is delivered to the subtracter 32 and an adder 35 through a delay circuit 37 from an AND gate 36 for feedback control. The delay circuit 37 is comprised of a group of D flip-flops of the dynamic type, and is adapted so that when the group of D-type flip-flops become operative by two-phase clocks $\phi_1$, $\phi_2$ delivered through an operation stop control circuit 38, it delays input data by one clock period to output delayed data.

The input control AND gate 31 and the feedback control AND gate 36 are such that their gates are opened and closed by an operation stop control signal delivered to a stop control input terminal 39.

The input control AND gate 31 and the feedback control AND gate 36 are respectively opened for an operation period during which the operation stop control signal is placed at high level. Thus, the input control AND gate 31 delivers input data of m bits to the subtracter 32, and the feedback control AND gate 36 delivers added output data of the adder 35 to the delay circuit 37. On the other hand, for an operation stop period during which the operation stop control signal is at low level, the input control gate 31 is closed to deliver, to the subtracter 32, input data where all bits are at low level, and the feedback control AND gate 36 delivers, to the delay circuit 37, data where all bits are at low level.

Further, the stop control circuit 38 generates two-phase clocks $\phi_1$, $\phi_2$ on the basis a clock $\phi$ delivered from a clock input terminal 40. This circuit 38 allows the group of D flip-flops of the delay circuit 37 to be operative with those two-phase clocks $\phi_1$, $\phi_2$ being as an enable input for an operation period during which an operation stop control signal delivered from the operation stop control input terminal 39 is at high level. On the other hand, for an operation stop period during which the operation stop control signal is at low level, the stop control circuit 38 allow the two-phase clocks $\phi_1$, $\phi_2$ to be both compulsorily placed at high level to allow the delay circuit 37 to be placed in a data through condition with each of master and slave latches of the group of D flip-flops constituting the delay circuit 37 being caused to be inoperative or inactive.

In the IIR filter of such configuration, it is brought into an operative or inactive state only for an operation period during which an operation stop control signal delivered to the stop control terminal 39 is at high level, and exhibits a notch filter characteristic having cut-off frequencies $f_{c1}$, $f_{c2}$ with a coefficient A given by the coefficient circuit 34 being as $A = \frac{1}{2}^n$:

$$f_{c1} = A \cdot f_s/4\pi$$

$$f_{c2} = f_s/2 - f_{c1}$$

Further, for an operation stop period during which the operation stop control signal is at low level, there is no possibility that transition of state may take place in respective components, and this notch filter can wait until the subsequent operation period in the state where an unnecessary power consumption is extremely small.

The FIR equalizer and/or the IIR filter shown as actual examples as described above are most suitable in the case where a sequence circuit, is used such that, it is in an ON state for a time period where a reproduced waveform is obtained and is switched to an OFF state for a time period where no reproduced waveform is obtained in a reproducing system where a reproduced waveform by the rotary head is discontinuously obtained as in a digital audio recording/reproducing system of the non-tracking system, e.g., disclosed in the Japanese Patent Application Laid Open No. 184948/1988 publication, or the Japanese Patent Application Laid Open No. 193375/1988 publication already proposed by the applicant of this invention.

As is clear from the foregoing description, in a complementary logic circuit according to this invention, since a sequence circuit is constituted by a delay circuit comprised of a group of D flip-flops of the dynamic type and a combination circuit, the occupation area thereof can be reduced to about one half of that in the case where a group of D flip-flops of the static type are used as the delay circuit. In addition, since all inputs of the combination circuit are compulsorily brought into a predetermined state by input control means during an operation stop period of the delay circuit means, and the delay circuit means is brought into a data through condition by the operation stop control means with each of master and slave latches of the group of D flip-flops constituting the delay circuit means being caused to be inoperative or inactive, there is no unnecessary power consumption due to a punch-through current in the operation stop condition, thus making it possible to reduce power consumption to much degree.

Accordingly, in accordance with this invention, in a complementary logic circuit constituting a sequence circuit used in a manner switched between ON state and OFF state, the occupation area and the power consumption can be reduced.

I claim:

1. A complementary logic circuit constituting a sequence circuit the operation thereof being stopped in response to a stop control signal, comprising:
   delay circuit means including a group of dynamic delay type flip-flops;
   combination circuit means connected to said delay circuit means for receiving and combining a plurality of inputs at a respective plurality of input terminals and feeding a combination signal representing said inputs to said delay circuit means;
   input control means connected to said plurality of input terminals of said combination circuit means for setting said inputs of said combination circuit means to a predetermined logic level during an operation stop period in response to the stop control signal; and operation stop control means connected to said delay circuit means and to said stop control signal for setting said delay circuit means to be inactive during the operation stop period in response to the stop control signal, so that said delay circuit means is brought into a data through condition for the operation stop period.

2. A complementary logic circuit as set forth in claim 1, wherein said operation stop control means generates a first clock and a second clock fed to said delay circuit means to allow said dynamic delay type flip-flops to be brought into an enable state, and to set said first clock and said second clock at high level during the operation stop period.

3. A complementary logic circuit as set forth in claim 2, wherein said operation stop period is dependent upon a stop control signal supplied to said input control means and said operation stop control means, simultaneously.

4. A complementary logic circuit as set forth in claim 3, wherein said input control means includes first AND gate means of which an output terminal is connected to a first input terminal of said plurality of input terminals of said combination circuit means, input data and the stop control signal being supplied respectively to a first input terminal and a second input terminal of said first AND gate means.

5. A complementary logic circuit as set forth in claim 4, wherein said input control means further comprises a second AND gate means, an output terminal of said second AND gate means being connected to a second input terminal of said plurality of input terminals of said combination circuit means and a first input terminal of said AND gate means being connected to an output of said delay circuit means, output data from said combination circuit means to be supplied to said delay circuit means being controlled by supplying the operation stop control signal to a second input terminal of said second AND gate means.

6. A complementary logic circuit the operation thereof being stopped in response to a stop control signal, comprising:

delay circuit means including a group of dynamic delay type flip-flops;

input control means connected to an input terminal of said delay circuit means for setting an input of said delay circuit means to a predetermined logic level during an operation stop state in response to said stop control signal; and operation stop control means connected to said delay circuit means and to said stop control signal for setting said delay circuit means to be inactive during the operation stop period so that said delay circuit means is brought into a data through condition during the operation stop period.

7. A complementary logic circuit as set forth in claim 6, wherein said operation stop control means generates a first clock and a second clock to be supplied to said delay circuit means to allow said delay circuit means to be brought into an enable state, and to set said first and second clocks at a high level during the operation stop period.

8. A complementary logic circuit as set forth in claim 7, wherein said input control means includes AND gate means of which an output terminal is connected to said input terminal of said delay circuit means, input data and the stop control signal being respectively supplied to a plurality of input terminals of said AND gate means, the operation stop period being dependent upon said stop control signal supplied to each of said input control means and said operation stop control means.

* * * * *